(12) United States Patent
Yoshida et al.

(10) Patent No.: US 10,867,821 B2
(45) Date of Patent: Dec. 15, 2020

(54) SUBSTRATE TRANSFER ROBOT AND METHOD OF TEACHING EDGE POSITION OF TARGET BODY

(71) Applicants: KAWASAKI JUKOGYO KABUSHIKI KAISHA, Kobe (JP); KAWASAKI ROBOTICS (USA), INC., Wixom, MI (US)

(72) Inventors: Tetsuya Yoshida, Kakogawa (JP); Mark Tang, Walnut Creek, CA (US)

(73) Assignees: KAWASAKI JUKOGYO KABUSHIKI KAISHA, Kobe (JP); KAWASAKI ROBOTICS (USA), INC., Wixom (*) Notice: Subject to any disclaimer, the term of this patent is extended or adjusted under 35 U.S.C. 154(b) by 186 days.

(21) Appl. No.: 16/127,491

(22) Filed: Sep. 11, 2018

(65) Prior Publication Data
US 2020/0083073 A1   Mar. 12, 2020

(51) Int. Cl.
*G05B 19/04* (2006.01)
*G05B 19/18* (2006.01)
*H01L 21/67* (2006.01)
*H01L 21/687* (2006.01)
*H01L 21/68* (2006.01)

(52) U.S. Cl.
CPC ...... *H01L 21/67259* (2013.01); *H01L 21/681* (2013.01); *H01L 21/68707* (2013.01)

(58) Field of Classification Search
CPC ............ H01L 21/67259; H01L 21/681; H01L 21/68707
See application file for complete search history.

(56) References Cited

U.S. PATENT DOCUMENTS

| 6,275,748 B1* | 8/2001 | Bacchi ............... H01L 21/6838 700/275 |
| 6,332,751 B1* | 12/2001 | Kozawa ................. B65H 9/00 250/206.1 |
| 7,706,919 B2 | 4/2010 | Adachi et al. |
| 2002/0042666 A1* | 4/2002 | Bacchi ............... H01L 21/6838 700/275 |

(Continued)

FOREIGN PATENT DOCUMENTS

| JP | H08-097269 A | 4/1996 |
| WO | 2003/022534 A1 | 3/2003 |

*Primary Examiner* — Harry Y Oh
(74) *Attorney, Agent, or Firm* — Oliff PLC

(57) ABSTRACT

A method of teaching the target body edge position includes moving a photoelectric sensor optical axis to an initial position specified on the target body edge outer side installed so that the target body main surface is horizontal, and specified upper or lower than the target body, repeating an optical axis forward cycle until the target body edge is detected by the sensor, and obtaining the target body edge detected point position based on the substrate transfer robot posture when the target body edge is detected by the sensor to store the edge position. A movement cycle includes a series of movements including lifting or lowering passing through a height level of the target body, forward movement by a first movement amount in a horizontal scanning direction toward the target body, lowering or lifting passing through the level, and forward movement by the first movement amount in the scanning direction.

6 Claims, 8 Drawing Sheets

(56) References Cited

U.S. PATENT DOCUMENTS

| | | | | |
|---|---|---|---|---|
| 2005/0034288 | A1* | 2/2005 | Adachi | H01L 21/68707 29/25.01 |
| 2006/0100740 | A1* | 5/2006 | Sakiya | B25J 9/1692 700/246 |
| 2006/0222236 | A1* | 10/2006 | Osada | H01L 21/681 382/151 |
| 2007/0067678 | A1* | 3/2007 | Hosek | G07C 3/00 714/25 |
| 2009/0269171 | A1* | 10/2009 | Iijima | H01L 21/67748 414/222.01 |
| 2014/0201571 | A1* | 7/2014 | Hosek | G06F 11/2257 714/26 |
| 2018/0122678 | A1* | 5/2018 | Yue | H01L 21/681 |

* cited by examiner

SUBSTRATE TRANSFER ROBOT AND METHOD OF TEACHING EDGE POSITION OF TARGET BODY

BACKGROUND OF THE INVENTION

(1) Field of the Invention

The present invention relates to a technique for teaching an edge position of a substrate by using a photoelectric sensor provided in a substrate holding hand in a substrate transfer robot.

(2) Description of Related Art

Conventionally, there has been known a substrate transfer robot including a transmissive photoelectric sensor at a distal end portion of a substrate holding hand. This photoelectric sensor is used, for example, to detect the presence or absence of a substrate accommodated in each slot of a substrate carrier. In addition to this intended purpose, the photoelectric sensor is used to automatically teach a substrate position and a substrate placement portion to the substrate transfer robot. WO 2003/022534 discloses this type of technology.

WO 2003/022534 discloses that a teaching jig in which a large disc portion that is the same in outer diameter as a semiconductor wafer and a small disc portion that is concentric with the large disc portion are arranged vertically is placed at a position to which the semiconductor wafer is placed, and the teaching jig is detected by a transmission-type sensor provided at the tips of a wafer gripping portion, whereby the position of the semiconductor wafer is automatically taught.

The method of positioning the small disc portion disclosed in WO 2003/022534 is as follows. That is, (1) as a result of a manipulation by an operator, the wafer gripping portion is moved to above the small disc portion; (2) the wafer gripping portion is lowered, a top surface of the small disc portion is detected by the transmission-type sensor, a Z-axis coordinate of the robot in this state is recorded; (3) the wafer gripping portion is lowered, and a bottom surface of the small disc portion is detected by the transmission-type sensor, a Z-axis coordinate of the robot in this state is recorded; (4) a height of the wafer gripping portion is set at the center of the top surface and the bottom surface of the small disc portion; (5) arms are contracted to such an extent that the transmission-type sensor comes not to detect the small disc portion; (6) the direction of the wafer gripping portion is changed, the wafer gripping portion is caused to approach the small disc portion slowly, θ-axis and R-axis coordinates of the robot that are obtained when: the transmission-type sensor first detects the small disc portion (i.e., the optical axis of the transmission-type sensor comes into contact with the circumferential surface of the small disc portion) are recorded; and (7) the steps (5) and (6) are executed repeatedly, the wafer gripping portion is caused to approach the small disc portion in different directions, plural sets of θ-axis and R-axis coordinates of the robot are obtained when the optical axis comes into contact with the circumferential surface of the small disc portion, and the position of the center of the small disc portion is determined on the basis of these values and recorded.

According to the technique disclosed in WO 2003/022534, in order to detect the position of the robot when the optical axis of the photoelectric sensor comes into contact with an edge (circumferential surface) of a circular substrate, first, the top and bottom surfaces of the substrate is detected while moving the optical axis along the Z-axis, whereby the position of the Z axis of the top and bottom surfaces of the substrate is specified. Then, the center of the position of the Z-axis of the top surface of the substrate and the position of the Z-axis of the bottom surface is set as the position of the Z-axis of the substrate, and the optical axis is moved in a plane perpendicular to the Z-axis at the position of the Z-axis of the substrate to detect the edge of the substrate. Thus, in order to specify the position in the plane perpendicular to the Z-axis of a substrate required truly, it is necessary to specify the position of the Z-axis of the substrate in the previous stage, so that processing takes much time. In addition, in order to specify the position of the Z-axis of the substrate, a considerable thickness is required for a teaching jig simulating the substrate, and it is difficult to apply such a teaching jig on an actual substrate.

SUMMARY OF THE INVENTION

The present invention has been made in view of the above circumstances, and an object of the present invention is to provide a technique for teaching a position of an edge of a plate-shaped target body to a substrate transfer robot including a hand to hold a substrate, a robot arm displacing the hand, and a photoelectric sensor provided at a distal end portion of the hand and is to propose a technique that can teach the position of the edge of the target body to the robot regardless of the thickness of the plate-shaped target body.

A method of teaching an edge position of a target body according to one embodiment of the present invention is a method of teaching a position of an edge of a plate-shaped target body to a substrate transfer robot including a hand to hold a substrate, a robot arm displacing the hand, and a photoelectric sensor provided at a distal end portion of the hand, this method includes moving an optical axis of the photoelectric sensor to a predetermined initial position specified on an outer side of the edge of the target body installed in such a posture that a main surface of the target body is horizontal, and specified upper or lower than the target body, repeating a predetermined forward cycle of the optical axis until the edge of the target body is detected by the photoelectric sensor, and obtaining a position of a detected point of the edge of the target body based on a posture of the substrate transfer robot when the edge of the target body is detected by the photoelectric sensor to store the position.

In this method, the forward cycle includes a series of movements including lifting or lowering passing through a height level of the target body, forward movement by a predetermined first movement amount in a predetermined horizontal scanning direction toward the target body, lowering or lifting passing through the height level of the target body, and forward movement by the first movement amount in the scanning direction.

A substrate transfer robot according to one embodiment of the present invention includes a robot body having a hand to hold a substrate, a robot arm displacing the hand, and a photoelectric sensor provided at a distal end portion of the hand and a controller having a memory storing an edge position teaching program and a processor executing the edge position teaching program.

In the edge position teaching program, the controller operates the robot body such that an optical axis of the photoelectric sensor moves to a predetermined initial position specified on an outer side of an edge of a plate-shaped target body installed in such a posture that a main surface of the target body is horizontal, and specified upper or lower than the target body, further operates the robot body such that a predetermined forward cycle of the optical axis is repeated until the edge of the target body is detected by the photoelectric sensor, and obtains a position of a detected point of the edge of the target body based on a posture of the robot body when the edge of the target body is detected by the photoelectric sensor to store the position.

The forward cycle includes a series of movements including lifting or lowering passing through the height level of the target body, forward movement by a predetermined first movement amount in a predetermined horizontal scanning direction toward the target body, lowering or lifting passing through the height level of the target body, and forward movement by the first movement amount in the scanning direction.

According to the substrate transfer robot and the method of teaching an edge position of a target body, since the vertical and horizontal positions of the edge of the target body are detected while repeating the movement cycle of the optical axis, there is no previous stage to specify the vertical position of the target body (that is, the position in the thickness direction). Thus, owing to omission of processing at the previous stage, the time required for processing can be shortened. Further, owing to the omission of the processing at the previous stage, the thickness of the target body is not limited.

The present invention can provide a technique for teaching the position of the edge of the plate-shaped target body to the substrate transfer robot including the hand to hold a substrate, the robot arm displacing the hand, and the photoelectric sensor provided at the distal end portion of the hand and can propose a technique that can teach the position of the edge of the target body to the robot regardless of the thickness of the plate-shaped target body.

DETAILED DESCRIPTION OF PREFERRED EMBODIMENTS

[Schematic Configuration of Substrate Transfer Robot 1]

Figure 1:
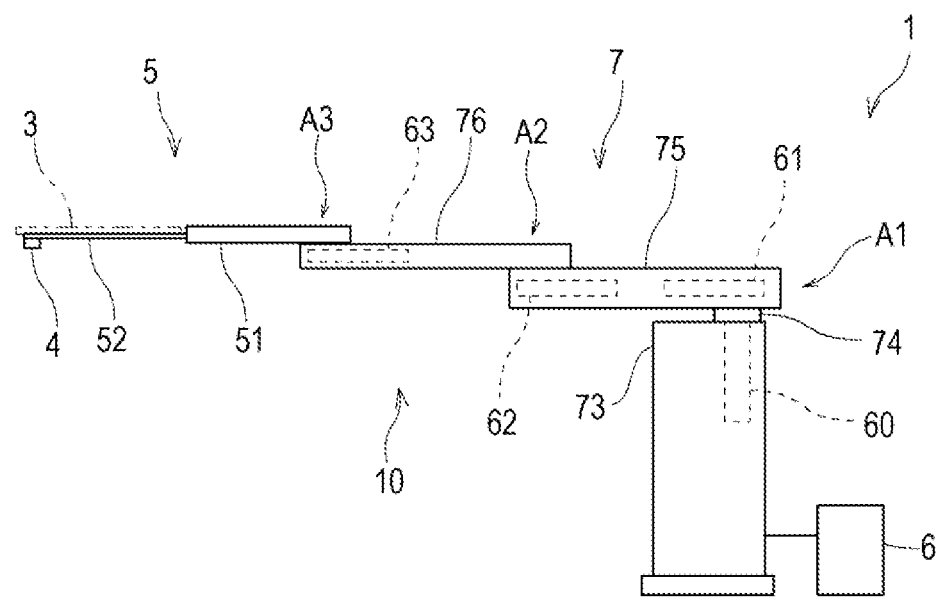
FIG. 1 is a schematic side view of a substrate transfer robot according to an embodiment of the present invention.
Figure 2:
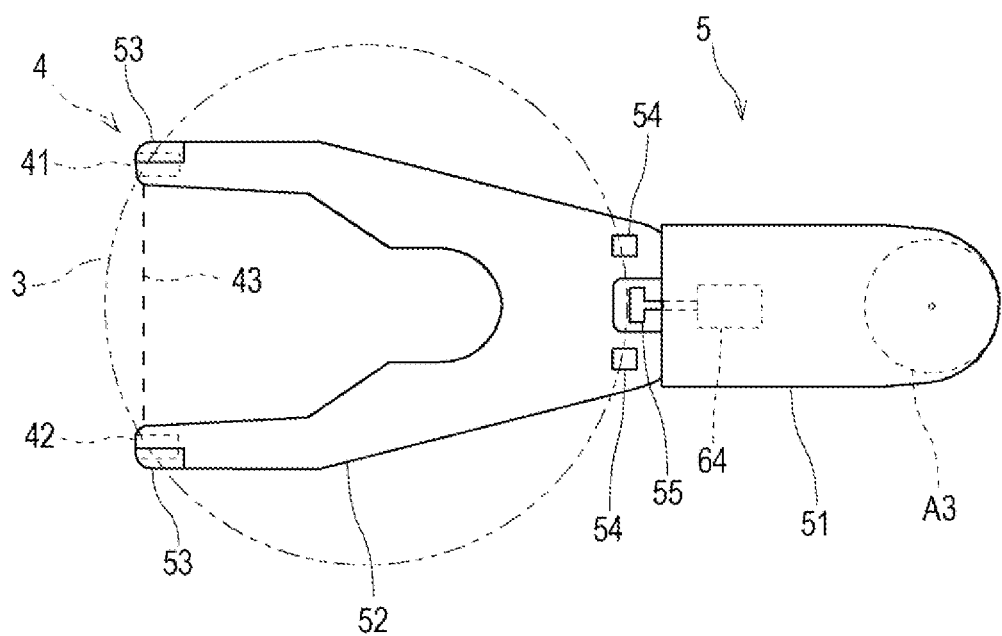
FIG. 2 is a plan view of a substrate holding hand.

FIG. 1 is a schematic side view of a substrate transfer robot 1 according to an embodiment of the present invention, and FIG. 2 is a plan view of a hand 5 of the substrate transfer robot 1 shown in FIG. 1. The substrate transfer robot 1 shown in FIGS. 1 and 2 includes a robot body 10 and a controller 6 that controls the operation of the robot body 10. The substrate transfer robot 1 carries in (loads) and carries out a substrate 3 with respect to a substrate placing portion (not shown). The substrate transfer robot 1 may be provided in a system transferring various types of the substrates 3 in an EFEM (Equipment Front End Module), a sorter, a substrate processing system, and the like.

[Configuration of Robot Body 10]

The robot body 10 has a base 73, a horizontal articulated robot arm (hereinafter referred to as "arm 7") supported by the base 73, a substrate holding hand (hereinafter referred to as "hand 5") connected to a distal end of the arm 7, and a transmissive photoelectric sensor 4 provided in the hand 5. In the present embodiment, although a transmissive photoelectric sensor is used as the photoelectric sensor 4, a regression reflection photoelectric sensor may be used instead of the transmissive photoelectric sensor.

The arm 7 includes a lifting/lowering shaft 74 supported by the base 73 and first and second links 75 and 76 extending in the horizontal direction. A proximal end of the first link 75 and a distal end of the lifting/lowering shaft 74 are connected via a first joint A1. A distal end of the first link 75 and a proximal end of the second link 76 are connected via a second joint A2. A distal end of the second link 76 and a proximal end of the hand 5 are connected via a wrist joint A3. The base 73 includes a lifting/lowering drive device 60 which drives the lifting/lowering shaft 74 to lift/lower it. The lifting/lowering drive device 60 includes, for example, a servo motor which angularly displaces according to a signal given from the controller 6, a power transmission mechanism which includes a speed reduction device and converts the power of the servo motor into a straightforward force to transmit the force to the lifting/lowering shaft 74, and a position detector which detects an angular displacement of the servo motor (none of which are shown). The first link 75 includes a first joint drive device 61 which drives the first joint A1 and a second joint drive device 62 which drives the second joint A2. The second link 76 includes a wrist joint drive device 63 which drives the first wrist joint A3 (see FIG. 3). The drive devices 61, 62, and 63 of the respective joints include a servo motor which angularly displaces according to a signal given from the controller 6, a power transmission mechanism which includes a speed reduction device and transmits the power of the servo motor to a link body, and a position detector which detects an angular displacement of the servo motor (none of which are shown).

The hand 5 includes a hand base portion 51 coupled to a distal end of the arm 7 via the wrist joint A3 and a blade 52 coupled to the hand base portion 51. The blade 52 is a thin plate member having Y-shaped (or U-shaped) branched distal end portions. A main surface of the blade 52 is horizontal, and a plurality of support pads 53 and 54 supporting the substrate 3 are provided on the blade 52. The plurality of support pads 53 and 54 are arranged so as to be in contact with an edge of the substrate 3 placed on the blade 52. In addition, on the proximal end side of the blade 52 in the hand 5, a pusher 55 moved forward and backward by the operation of an air cylinder 64 is provided. The substrate 3 placed on the blade 52 is gripped between the pusher 55 and the support pad 53 disposed at the distal end portion of the blade 52. Although a method of holding the substrate 3 with the hand 5 according to the present embodiment is an edge grip method, a well-known method of holding the substrate 3, such as an adsorption method, a drop-in method, or placement method, may be adopted in place of the edge grip method.

The hand 5 includes at least one pair of photoelectric sensors 4. The photoelectric sensor 4 is provided on a back surface of the branched distal end portion of the blade 52. The photoelectric sensor 4 includes a light projector 41 provided at one of the branched distal end portions of the blade 52 and a light receiver 42 provided at the other distal end portion. The light projector 41 and the light receiver 42 are separated in a direction parallel to the main surface of the blade 52 (that is, in the horizontal direction).

The light projector 41 includes a light source for projecting light serving as a detection medium. The light receiver 42 includes a light receiving element which receives the projection light from the light projector 41 and converts the projection light into an electric signal. The light projector 41 and the light receiver 42 are opposed to each other, and the light emitted from the light projector 41 advances linearly and enters a light entering window of the light receiver 42. In FIG. 2, an optical axis 43 of the light emitted from the light projector 41 is indicated by a chain line. The photoelectric sensor 4 outputs a detection signal to the controller 6 when detecting that an object has passed through the optical axis 43 and the amount of light incident on the light receiver 42 has decreased.

[Configuration of Control System of Substrate Transfer Robot 1]

Figure 3:
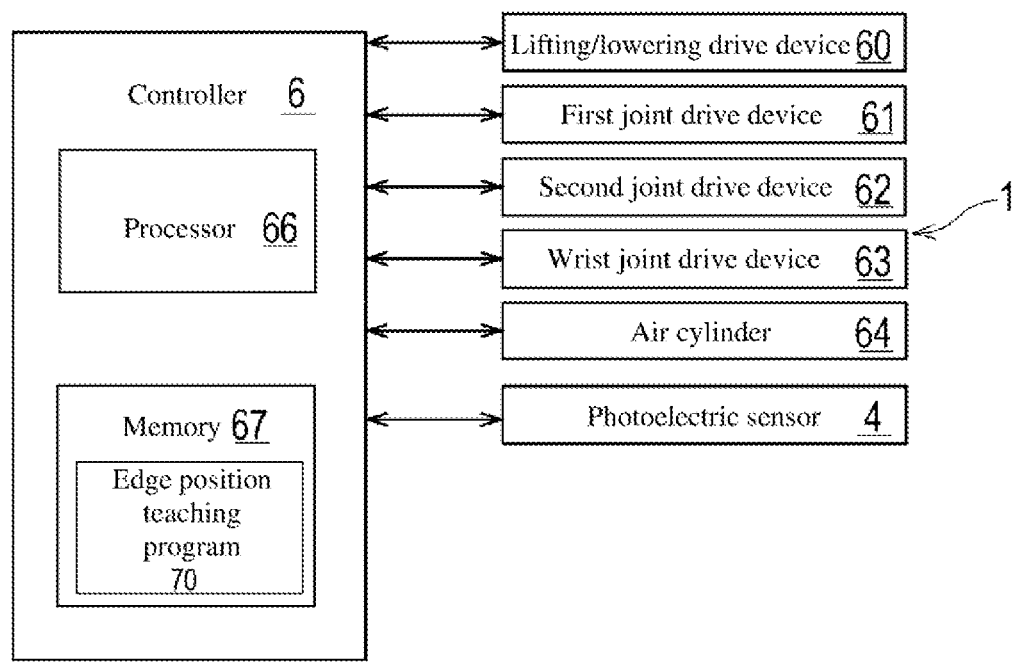
FIG. 3 is a block diagram showing a configuration of a control system of the substrate transfer robot.

FIG. 3 is a block diagram showing a configuration of a control system of the substrate transfer robot 1. The controller 6 is a so-called computer which has, for example, a processor 66 such as a microcontroller, CPU, MPU, PLC, DSP, ASIC or FPGA, and a memory 67 including a ROM and a RAM. The memory 67 stores programs executed by the processor 66, including an edge position teaching program 70. In addition, the memory 67 stores setting data such as an initial position, a first movement amount, a second movement amount, a shape of the substrate 3 (target body 30), and an approximate placement position of the substrate 3, which are used for processing performed by the processor 66, and various data including teaching point data and the like.

In the controller 6, the processor 66 reads and executes software such as a program stored in the memory 67, so that processing for controlling the operation of the robot body 10 is performed. It should be noted that the controller 6 may be configured as a single computer performing each processing by centralized control, or may be configured as a plurality of computers performing distributed control in cooperation with each other, thereby performing each processing.

More specifically, the controller 6 is electrically connected to the lifting/lowering drive device 60, the first joint drive device 61, the second joint drive device 62, the wrist joint drive device 63, and the photoelectric sensor 4. The controller 6 acquires rotation positions of the servo motors from the position detectors included in these drive devices and calculates a target pose based on a pose (position and orientation) of the hand 5 corresponding to the rotation positions and stored teaching point data. In addition, the controller 6 outputs a control command to a servo amplifier, such that the hand 5 is placed in the target pose. The servo amplifier supplies driving electric power to each servo motor based on the control command, whereby the hand 5 is moved and placed in the target pose.

[Method of Teaching Edge Position of Target Body 30]

Figure 4:
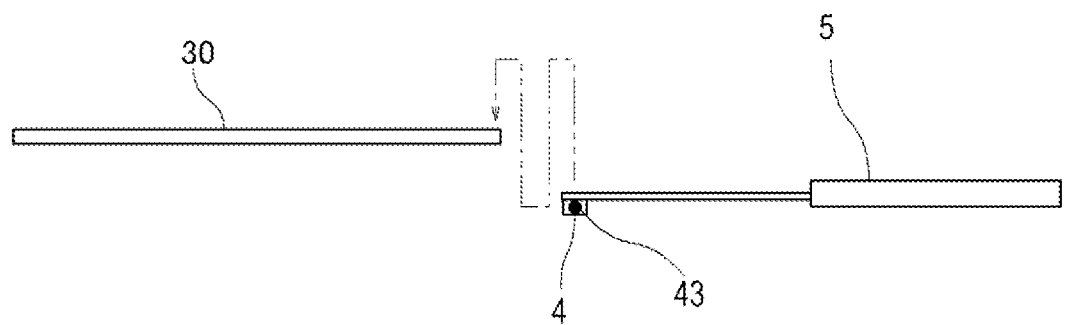
FIG. 4 is a view for explaining a method of teaching an edge position of a target body.
Figure 4A:
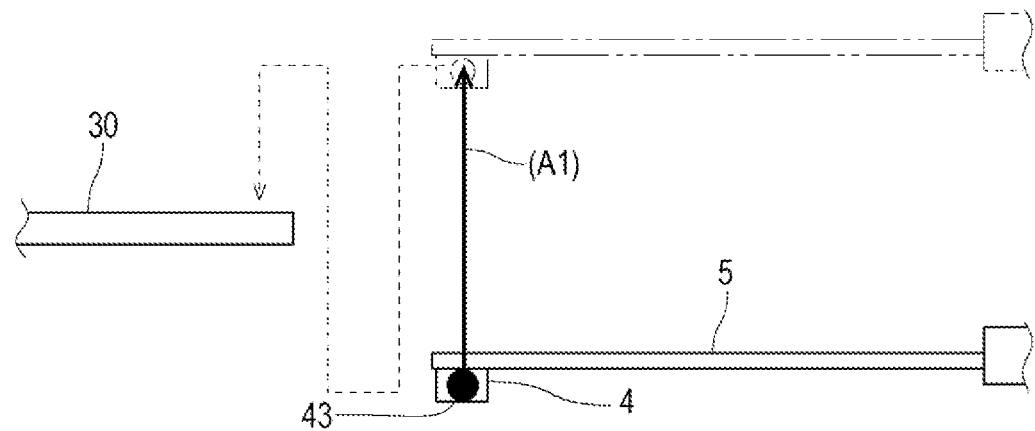
FIGS. 4A-4D exemplarily illustrate a series of movements shown in FIG. 4.
Figure 4B:
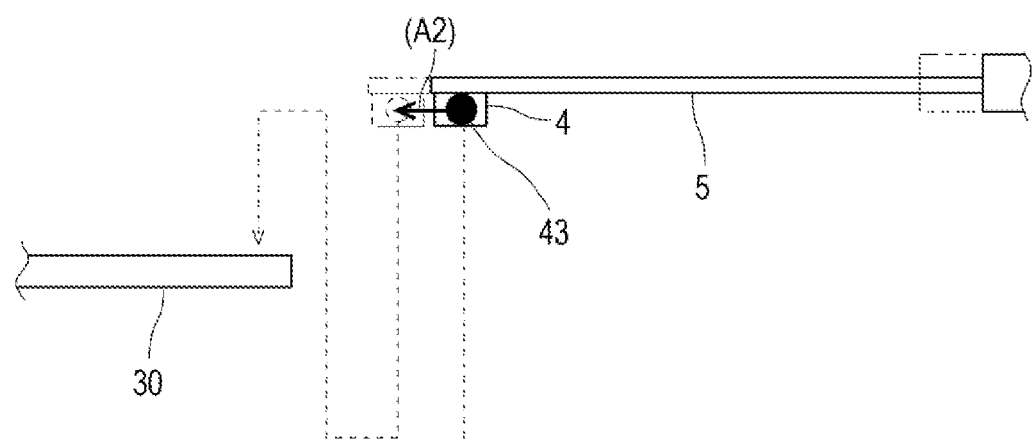
Figure 4C:
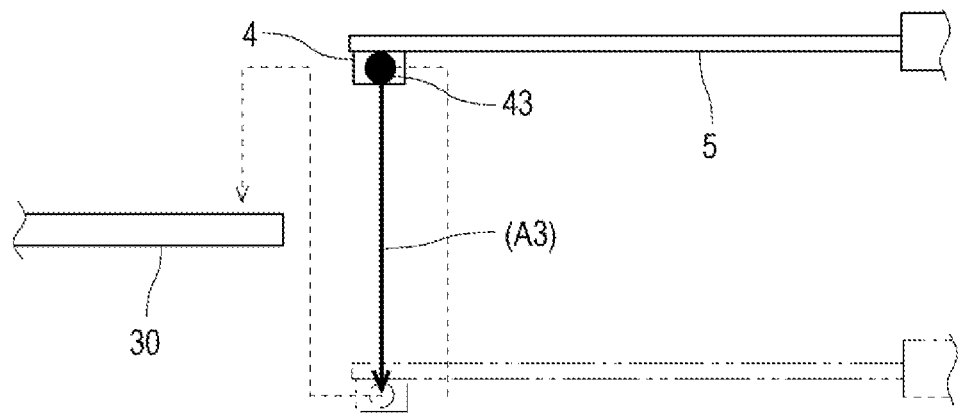
Figure 4D:
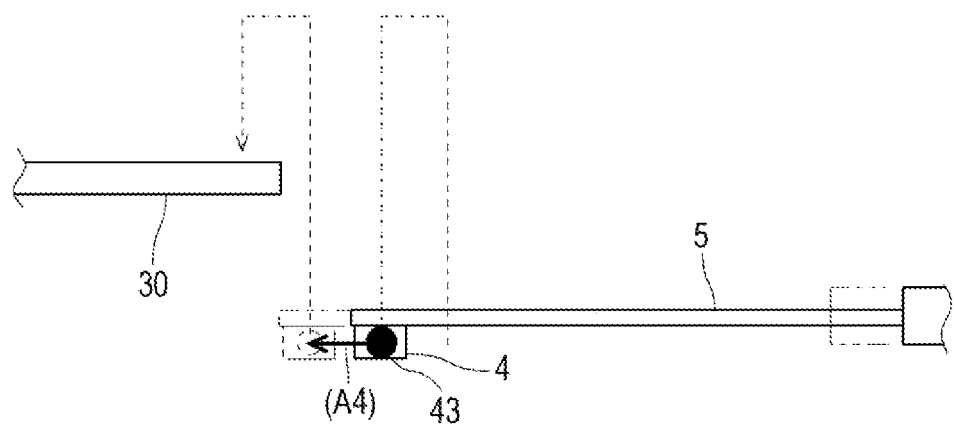
Figure 5:
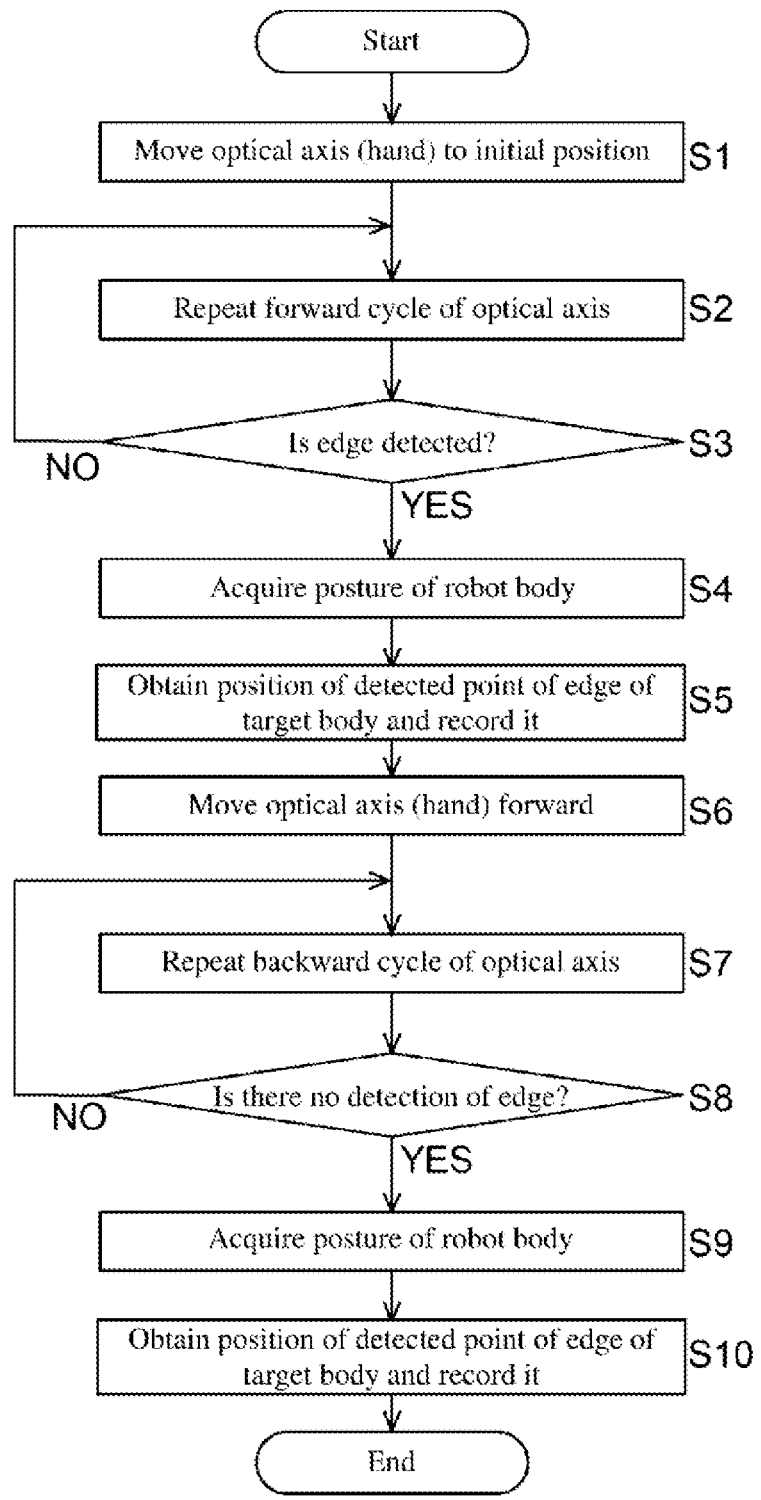
FIG. 5 is a flowchart of processing of teaching the edge position of the target body.

Hereinafter, a method of teaching an edge position of the target body 30, which is performed by the substrate transfer robot 1 having the above configuration, will be described with reference to FIGS. 4 and 5. FIG. 4 is a view for explaining the method of teaching the edge position of the target body 30 (FIGS. 4A-4D exemplarily illustrate a series of movements shown in FIG. 4), and FIG. 5 is a flowchart of processing of teaching the edge position of the target body 30. In the controller 6, the processor 66 executes the edge position teaching program 70, whereby the processing relating to teaching of the edge position of the target body 30 is performed in the substrate transfer robot 1.

As shown in FIG. 4, the plate-shaped target body 30 is placed at a position ahead of the optical axis 43 of the photoelectric sensor 4 provided in the hand 5 in such a posture that the main surface of the target body 30 is horizontal. The target body 30 may be placed on any teaching jig or may be accommodated in a container such as a carrier. Although the target body 30 may be the substrate 3 or a disc-shaped object imitating the substrate 3, an outer shape of the target body 30 is not limited to a circular shape.

First, the controller 6 operates the robot body 10 so as to move the optical axis 43 (hand 5) of the photoelectric sensor 4 to an initial position (step S1). The initial position is an arbitrary position where the optical axis 43 of the photoelectric sensor 4 is not in contact with the substrate 3, the optical axis 43 is in proximity to the edge of the target body 30 on the outer side of the edge, and the optical axis 43 is located lower (or upper) than the target body 30. The robot body 10 may be operated so as to move the hand 5 to the initial position taught in advance, or the robot body 10 may be operated such that the hand 5 is moved to an arbitrary initial position by remote control by an operator.

Subsequently, the controller 6 causes the robot body 10 to perform a detection operation (step S2). In the detection operation, the controller 6 sets a series of movements including the following (A1)-(A4) shown in FIGS. 4A-4D as one forward cycle and operates the robot body 10 such that the optical axis 43 (hand 5) repeats the forward cycle until the edge of the target body 30 is detected by the photoelectric sensor 4. The initial position may be set such that the edge of the target body 30 is detected after the forward cycle is performed once or more. The forward cycle includes (A1) lifting (or lowering) passing through the height level of the target body 30 (as shown in FIG. 4A), (A2) forward movement by a predetermined first movement amount in a predetermined horizontal scanning direction toward the target body 30 (as shown in FIG. 4B), (A3) lowering (or lifting) passing through the height level of the target body 30 (as shown in FIG. 4C), and (A4) forward movement by the first movement amount in a scanning direction toward the target body 30 (as shown in FIG. 4D).

In the above description, the "height level of the target body 30" may be an approximate height position of the target body 30 stored in advance in the controller 6. Further, in the above description, the "scanning direction" of the target body 30 is an arbitrary horizontal direction from an initial position to an approximate center position of the target body 30. The controller 6 may determine the scanning direction from the stored coordinates of the initial position and the coordinates of the approximate center position of the target body 30, or the scanning direction may be stored in advance in the controller 6. Furthermore, in the above description, the "first movement amount" is an arbitrary extremely small value. Although the first movement amount of (A2) and the first movement amount of (A4) are basically the same value, they may be different values. The movement of the hand 5 (or the optical axis 43) repeating the above-mentioned forward cycle can be compared to an operation in which a dog sniffs around.

The edge of the target body 30 is detected by the photoelectric sensor 4 while the optical axis 43 (hand 5) repeats the forward cycle. When the edge of the target body 30 is detected by the photoelectric sensor 4 (YES in step S3), the controller 6 acquires and stores a posture of the robot body 10 (rotation position detected by each position detector) (step S4) and obtains a position of a detected point of the edge of the target body 30 from these values to record the position (step S5).

Through the processing of steps S1 to S5, the position of the edge of the target body 30 can be automatically taught to the substrate transfer robot 1. However, when the processing after step S6 described below is further added, a more highly reliable and detailed position of the edge of the target body 30 can be automatically taught to the substrate transfer robot 1.

The controller 6 operates the robot body 10 such that the optical axis 43 moves forward by a predetermined amount in the scanning direction from the position of the edge of the target body 30 stored in step S5, and the optical axis 43 is moved to a position lower (or upper) than the target body 30 (step S6). Here, the "predetermined amount" is such a movement amount of the hand 5 (or the optical axis 43) that the hand 5 does not abut against the target body 30 when the hand 5 after movement is lifted or lowered and the optical axis 43 passes through the target body 30, and the predetermined amount is stored in advance in the controller 6.

Figure 6:
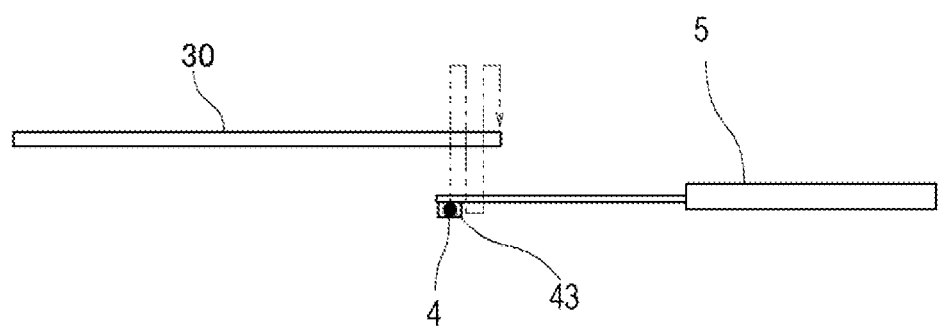
FIG. 6 is a view for explaining the method of teaching the edge position of the target body.
Figure 6A:
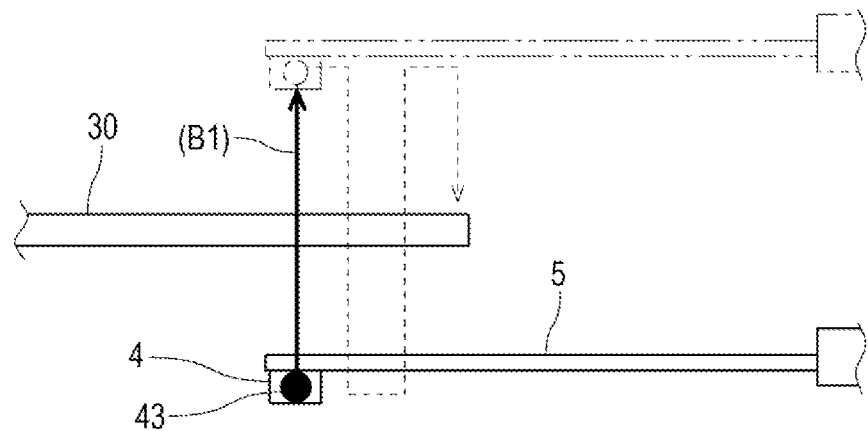
FIGS. 6A-6D exemplarily illustrate a series of movements shown in FIG. 6.
Figure 6B:
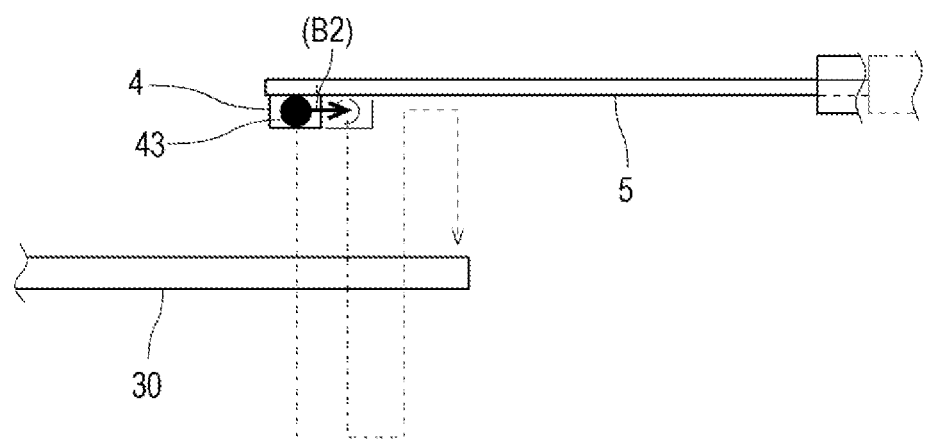
Figure 6C:
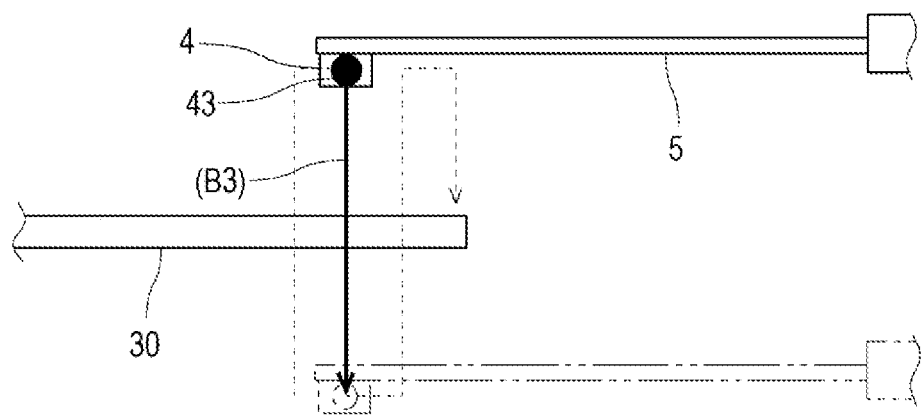
Figure 6D:
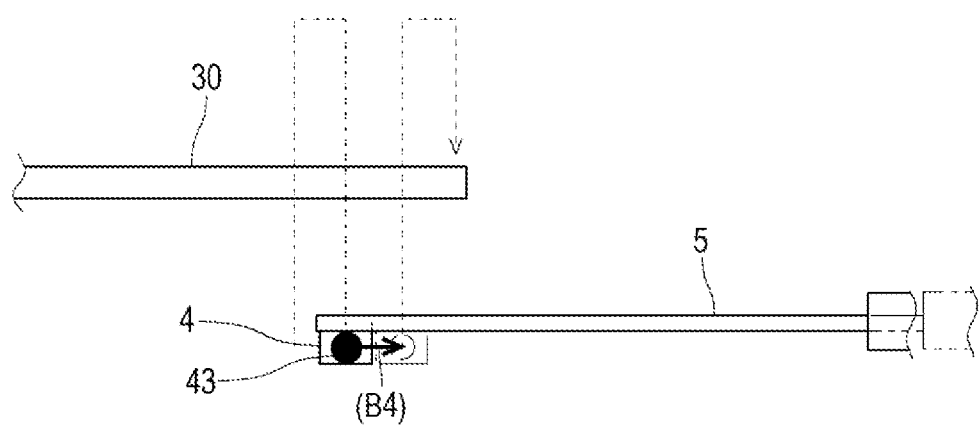

Subsequently, the controller 6 causes the robot body 10 to perform a detection operation (step S7). In the detection operation, as shown in FIG. 6, the controller 6 sets a series of movements of the following (B1) to (B4) shown in FIGS. 6A-6D as one backward cycle and operates the robot body 10 such that the optical axis 43 (hand 5) repeats the backward cycle until there is no detection of the edge of the target body 30 with the photoelectric sensor 4. The above-mentioned predetermined position may be set such that the edge of the target body 30 is not detected after the backward cycle is performed once or more. The backward cycle includes (B1) lifting (or lowering) passing through the height level of the target body 30 (as shown in FIG. 6A), (B2) backward movement by a predetermined second movement amount in the scanning direction so as to approach the edge of the target body 30 (as shown in FIG. 6B), (B3) lowering (or lifting) passing through the height level of the target body 30 (as shown in FIG. 6C), and (B4) backward movement by a second movement amount in the scanning direction so as to approach the edge of the target body 30 (as shown in FIG. 6D).

In the above description, the direction of "backward movement" is opposite to the direction of "forward movement" described above. Further, in the above description, the "second movement amount" is an arbitrary extremely small value that is equal to or smaller than the first movement amount. It is desirable that the second movement amount is smaller than the first movement amount. Although the second movement amount of (B2) and the second movement amount of (B4) are basically the same value, they may be different values.

The detection of the edge of the target body 30 with the photoelectric sensor 4 is stopped while the optical axis 43 (hand 5) repeats the backward cycle. When the detection of the edge of the target body 30 with the photoelectric sensor 4 is stopped (YES in step S8), the controller 6 acquires and stores a posture of the robot body 10 (rotation position detected by each position detector) (step S9) and obtains a position of a second detected point of the edge of the target body 30 from these values to record the position (step S10).

When the position of the first detected point of the edge of the target body 30 is the same as the position of the second detected point of the edge of the target body 30, the controller 6 teaches the position of the first (or second) detected point as the position of the edge of the target body 30. When the position of the first detected point of the edge of the target body 30 is different from the position of the second detected point of the edge of the target body 30, the controller 6 further retracts the optical axis 43 in the scanning direction and then may repeat steps S2 to S5 to obtain the position of a third detected point of the edge of the target body 30. In this case, each time the controller 6 repeats the detection operation (steps S2 and S7), it is advisable to reduce a forward or backward movement amount.

With the above processing, the position of the edge of the target body 30 can be automatically taught to the substrate transfer robot 1. A center position of the circular substrate 3 can be taught to the substrate transfer robot 1 by applying the method of teaching the position of the edge of the target body 30. Specifically, using the method of teaching the position of the edge of the target body 30, the position is detected with three or more different edges of the substrate 3, and the center position of the substrate 3 can be obtained from these positions by calculation.

As described above, the substrate transfer robot 1 according to the present embodiment includes the robot body 10 having the hand 5 to hold the substrate 3, the robot arm 7 displacing the hand 5, and the photoelectric sensor 4 provided at a distal end portion of the hand 5 and the controller 6 having the memory 67 storing the edge position teaching program 70 and the processor 66 executing the edge position teaching program 70. In the edge position teaching program 70, the controller 6 operates the robot body 10 such that the optical axis 43 of the photoelectric sensor 4 moves to a predetermined initial position specified on an outer side of the edge of the plate-shaped target body 30 installed in such a posture that the main surface of the target body 30 is horizontal, and specified upper or lower than the target body 30, further operates the robot body 10 such that a predetermined forward cycle of the optical axis 43 is repeated until the edge of the target body 30 is detected by the photoelectric sensor 4, and obtains a position of the edge of the target body 30 based on the posture of the robot body 10 when the edge of the target body 30 is detected by the photoelectric sensor 4 to store the edge position. The forward cycle includes a series of movements including lifting or lowering passing through the height level of the target body 30, forward movement by a predetermined first movement amount in a predetermined horizontal scanning direction toward the target body 30, lowering or lifting passing through the height level of the target body 30, and forward movement by the first movement amount in the scanning direction.

The method of teaching the edge position of the target body of the present embodiment is a method of teaching the position of the edge of the plate-shaped target body 30 to the substrate transfer robot 1, and this method includes moving the optical axis 43 of the photoelectric sensor 4 to a predetermined initial position specified on an outer side of the edge of the target body 30 installed in such a posture that the main surface is horizontal, and specified upper or lower than the target body 30, repeating a predetermined forward cycle of the optical axis 43 until the edge of the target body 30 is detected by the photoelectric sensor 4, and obtaining the position of the edge of the target body 30 based on the posture of the substrate transfer robot 1 when the edge of the target body 30 is detected by the photoelectric sensor 4 to store the edge position. The forward cycle includes a series of movements including lifting or lowering passing through a height level of the target body 30, forward movement by a predetermined first movement amount in a predetermined horizontal scanning direction toward the target body 30, lowering or lifting passing through the height level of the target body 30, and forward movement by the first movement amount in the scanning direction.

According to the substrate transfer robot 1 and the method of teaching the edge position of the target body, since the vertical and horizontal positions of the edge of the target body 30 are detected while repeating the movement cycle of the optical axis 43, there is no previous stage to specify the vertical position of the target body 30 (that is, the position in the thickness direction). Thus, owing to omission of processing at the previous stage, the time required for processing can be shortened. Further, owing to the omission of the processing at the previous stage, the thickness of the target body 30 is not limited.

As described in the above embodiment, in the substrate transfer robot 1, the edge position teaching program 70 may be configured such that after the edge of the target body 30 is detected by the photoelectric sensor 4, the controller 6 operates the robot body 10 such that the optical axis 43 moves forward in the scanning direction by a predetermined amount, further operates the robot body 10 such that a predetermined backward cycle of the optical axis 43 is repeated until there is no detection of the edge of the target body 30 with the photoelectric sensor 4, and obtains the position of the edge of the target body 30 based on the posture of the robot body 10 when there is no detection of the edge of the target body 30 with the photoelectric sensor 4 to store the position. In this case, the backward cycle includes a series of movements including lifting or lowering passing through the height level of the target body 30, backward movement by a predetermined second movement amount in the scanning direction, lowering or lifting passing through the height level of the target body 30, and backward movement by a second movement amount in the scanning direction.

Similarly, as described in the above embodiment, the method of teaching the edge position may further include moving forward the optical axis 43 by a predetermined amount in the scanning direction after the edge of the target body 30 is detected by the photoelectric sensor 4 and then repeating a predetermined backward cycle of the optical axis 43 until there is no detection of the edge of the target body 30 with the photoelectric sensor 4 and obtaining the position of the edge of the target body 30 based on the posture of the substrate transfer robot 1 when there is no detection of the edge of the target body 30 with the photoelectric sensor 4 to store the position. In this case, the backward cycle includes a series of movements including lifting or lowering passing through the height level of the target body 30, backward movement by a predetermined second movement amount in the scanning direction, lowering or lifting passing through the height level of the target body 30, and backward movement by a second movement amount in the scanning direction.

According to the substrate transfer robot 1 and the method of teaching the edge position of the target body 30, detection is performed a plurality of times on the same portion of the edge of the target body 30. As a result, reliability of the detected position of the edge of the target body 30 can be increased.

Further, in the substrate transfer robot 1 and the method of teaching the edge position of the target body 30, it is desirable that the second movement amount is smaller than the first movement amount.

As a result, the position of the edge of the target body 30 can be detected with finer precision.

Although the preferred embodiment of the present invention has been described, specific structural and/or functional details of the above embodiment may be altered without departing from the spirit of the present invention.

What is claimed is:

1. A method of teaching an edge position of a target body, which is a method of teaching a position of an edge of a plate-shaped target body to a substrate transfer robot including a hand to hold a substrate, a robot arm displacing the hand, and a photoelectric sensor provided at a distal end portion of the hand, the method comprising:
   moving an optical axis of the photoelectric sensor to a predetermined initial position specified on an outer side of the edge of the target body installed in such a posture that a main surface of the target body is horizontal, and specified to be upper or lower than the target body;
   repeating a predetermined forward cycle of the optical axis until the edge of the target body is detected by the photoelectric sensor; and
   obtaining a position of the edge of the target body based on a posture of the substrate transfer robot when the edge of the target body is detected by the photoelectric sensor to store the position,
   wherein the forward cycle includes a series of following movements (A1) to (A4) performed in that order:
   (A1) lifting or lowering the optical axis passing through a height level of the target body,
   (A2) moving the optical axis forward by a predetermined first movement amount in a predetermined horizontal scanning direction toward the target body,
   (A3) lowering or lifting the optical axis passing through the height level of the target body, and
   (A4) moving the optical axis forward by the first movement amount in the scanning direction.

2. The method of teaching an edge position according to claim 1, further comprising:
   moving the optical axis forward by a predetermined amount in the scanning direction after the edge of the target body is detected by the photoelectric sensor and then repeating a predetermined backward cycle of the optical axis until there is no detection of the edge of the target body with the photoelectric sensor; and
   obtaining the position of the edge of the target body based on the posture of the substrate transfer robot when there is no detection of the edge of the target body with the photoelectric sensor to store the position,
   wherein the backward cycle includes a series of following movements (B1)-(B4) performed in that order:
   (B1) lifting or lowering the optical axis passing through the height level of the target body,
   (B2) moving the optical axis backward by a predetermined second movement amount in the scanning direction,
   (B3) lowering or lifting the optical axis passing through the height level of the target body, and
   (B4) moving the optical axis backward by the second movement amount in the scanning direction.

3. The method of teaching an edge position according to claim 2,
   wherein the second movement amount is smaller than the first movement amount.

4. A substrate transfer robot comprising:
   a robot body having a hand to hold a substrate, a robot arm displacing the hand, and a photoelectric sensor provided at a distal end portion of the hand; and a controller having a memory storing an edge position teaching program and a processor executing the edge position teaching program, wherein:
in the edge position teaching program, the controller
operates the robot body such that an optical axis of the photoelectric sensor moves to a predetermined initial position specified on an outer side of an edge of a plate-shaped target body installed in such a posture that a main surface of the target body is horizontal, and specified to be upper or lower than the target body,
operates the robot body such that a predetermined forward cycle of the optical axis is repeated until the edge of the target body is detected by the photoelectric sensor, and
obtains a position of the edge of the target body based on a posture of the robot body when the edge of the target body is detected by the photoelectric sensor to store the position, and
the forward cycle includes a series of following movements (A1)-(A4) performed in that order:
(A1) lifting or lowering the optical axis passing through the height level of the target body,
(A2) moving the optical axis forward by a predetermined first movement amount in a predetermined horizontal scanning direction toward the target body,
(A3) lowering or lifting the optical axis passing through the height level of the target body, and
(A4) moving the optical axis forward by the first movement amount in the scanning direction.

5. The substrate transfer robot according to claim 4, wherein:
in the edge position teaching program, the controller
operates the robot body such that the optical axis moves forward in the scanning direction by a predetermined amount after the edge of the target body is detected by the photoelectric sensor,
operates the robot body such that a predetermined backward cycle of the optical axis is repeated until there is no detection of the edge of the target body with the photoelectric sensor, and
obtains the position of the edge of the target body based on the posture of the robot body when there is no detection of the edge of the target body with the photoelectric sensor to store the position, and
the backward cycle includes a series of following movements (B1)-(B4) performed in that order:
(B1) lifting or lowering the optical axis passing through the height level of the target body,
(B2) moving the optical axis backward by a predetermined second movement amount in the scanning direction,
(B3) lowering or lifting the optical axis passing through the height level of the target body, and
(B4) moving the optical axis backward by the second movement amount in the scanning direction.

6. The substrate transfer robot according to claim 5, wherein the second movement amount is smaller than the first movement amount.

* * * * *